United States Patent [19]
Honda et al.

[11] Patent Number: 5,355,009
[45] Date of Patent: Oct. 11, 1994

[54] SEMICONDUCTOR DEVICE AND METHOD OF FABRICATING SAME

[75] Inventors: Hiroki Honda; Kimiharu Uga; Masahiro Ishida; Yoshiyuki Ishigaki, all of Itami, Japan

[73] Assignee: Mitsubishi Denki Kabushiki Kaisha, Tokyo, Japan

[21] Appl. No.: 875,019

[22] Filed: Apr. 28, 1992

[30] Foreign Application Priority Data

Jul. 19, 1991 [JP] Japan ................... 3-204880
Dec. 19, 1991 [JP] Japan ................... 3-336479

[51] Int. Cl.⁵ ........................................... H01L 27/02
[52] U.S. Cl. ........................... 257/370; 257/371; 257/378; 257/565; 257/587; 257/592; 257/740; 257/773; 257/774; 257/750
[58] Field of Search ............... 257/740, 773, 370, 371, 257/378, 565, 587, 592, 774, 750

[56] References Cited

U.S. PATENT DOCUMENTS

| 4,962,414 | 10/1990 | Liou et al. | 257/740 |
| 5,089,872 | 2/1992 | Ozturk et al. | 257/740 |
| 5,220,199 | 6/1993 | Owada et al. | 257/773 |

OTHER PUBLICATIONS

"A High Speed Super Self-Aligned Bipolar-CMOS Technology", IEDM IEEE, 1987 Chptr 2.4, pp. 24–27, AT&T Bell Lab., Tzu-Yin Chiu et al.

"0.8 μm Bi-CMOS Technology with High $f_T$ Ion-Implanted Emitter Bipolar Transistor", IEDM IEEE, 1987, Chptr 2.5, pp. 28–31, Semiconductor Device Engineering Lab, Toshiba Corp., H. Iwai et al.

"An 0.8 μm 256K BiCMOS SRAM Technology", IEDM IEEE 1987, Chptr 2.9, pp. 841–843, Semiconductor Process and Des. Ctr., R. H. Havemann et al.

Primary Examiner—Edward Wojciechowicz
Attorney, Agent, or Firm—Oblon, Spivak, McClelland, Maier & Neustadt

[57] ABSTRACT

Insulator films (5) formed on an epitaxial layer (3) are opened such that external base regions (17) are not covered with the insulator films (5). Cross sections (14a) of the insulator films (5) are concavely sloped downward from the insulator films (5) toward an intrinsic base region (18) in the vicinity of the epitaxial layer (3). Base electrodes (15) which are in contact with the insulator films (5) along the cross sections (14a) are connected to the external base regions (17), so that coverage of the base electrodes (15) over the external base regions (17) is improved. The base resistance of a bipolar transistor (101) is reduced.

6 Claims, 9 Drawing Sheets

SEMICONDUCTOR DEVICE AND METHOD OF FABRICATING SAME

BACKGROUND OF THE INVENTION

1. Field of the Invention

The present invent ion relates to a semiconductor device and a method of fabricating the same. More particularly, the invention relates to a bipolar transistor and a BiCMOS device including the bipolar transistor and an MOS transistor on the same semiconductor substrate.

2. Description of the Background Art

FIG. 9 is a cross-sectional view of a conventional bipolar transistor 100. An epitaxial layer 3 is formed on a semiconductor substrate 1. A floating collector 2 is formed in a boundary between the semiconductor substrate 1 and epitaxial layer 3. An intrinsic base region 18 and an emitter region 21 are formed in the upper part of the epitaxial layer 3. These elements form the bipolar transistor 100. A collector wall 6 which pierces the epitaxial layer 3 is connected to the floating collector 2.

The epitaxial layer 3 in the upper part is connected to an external base regoin 17 which is connected to the intrinsic base region 18. A base electrode 15 is connected from above to the external base region 17, and is insulated from the epitaxial layer 3 by selectively formed insulator films 5.

An emitter extracting electrode 20 is connected from above to the emitter region 21, and is insulated from the base electrode 15 by insulator films 16 and side walls 19 made of insulative material. The bipolar transistor 100 is fabricated in the manner described below. Initially, the insulator film 5 is formed over the epitaxial layer 3, and a desired resist pattern 13 is formed on the insulator film 5, as shown in FIG. 10. Anisotropic etching is performed on the insulator film 5 using the resist pattern 13 as a mask to form a desired opening in the insulator film 5 as shown in FIG. 11. This permits cross sections 14 of the insulator film 5 to appear. The regions 17, 18, 21 and electrodes 15, 20 are then formed.

This type of bipolar transistor is used in a BiCMOS device further including a MOS transistor.

The opening of the insulator film is thus formed above the base region of the conventional bipolar transistor. The cross section 14 of the insulator film 5 is approximately perpendicular to the semiconductor substrate 1. This causes the problem of deteriorating coverage of the base electrode 15 formed after the opening of the insulator, resulting in an increasing base resistance.

Another problem arises in formation of the BiCMOS device including the bipolar transistor 100 shown in FIG. 9. This type of BiCMOS device is disclosed in Japanese Patent Application Laid-Open No. 2-253654, for example. The steps described below are carried out to form a BiCMOS device 300 shown in FIG. 15 which includes the bipolar transistor 100 and an MOS transistor 200.

A layer the conductivity type of which is opposite to that of the semiconductor substrate 1 is formed in the lower part of a region in which the bipolar transistor 100 is to be formed on the semiconductor substrate 1. Epitaxial growth is performed to form the buried layer 2 and epitaxial layer 3. A well 4 is formed in the lower part of a region in which the MOS transistor 200 is to be formed. The insulator films 5 are selectively formed by means of the LOCOS process and the like. The collector wall 6, a gate insulator film 7 and a gate electrode 8 are formed in this order. Ion implantation using the gate insulator film 7 and gate electrode 8 as a mask is performed to form source-drains 9 of low concentration. After the formation of an insulator film over the top surface, anisotropic etching is performed on the insulator film to the depth equivalent to the thickness of the insulator film to form side walls 10 on the end faces of the gate electrode 8. Source-drains 11 of high concentration are formed by ion implantation. The MOS transistor 200 is completed (in FIG. 12).

In the fabrication of the MOS transistor 200, the insulator films 5 isolate the MOS transistor 200 from the region in which the bipolar transistor 100 is to be formed and protect the epitaxial layer 3 in this region from damages during the formation of the side walls 10.

The insulator film 5 is etched by using the resist pattern 13 to expose the epitaxial layer 3. After the appearance of an opening H, implantation of ions the conductivity type of which is the same as that of the semiconductor substrate 1 is performed by using the same resist pattern 13, so that the intrinsic base region 18 is formed (in FIG. 13). At this time, the insulator films 5 present the cross sections 14.

The resist pattern 13 is removed, and polycrystalline silicon is formed over the structure obtained in the foregoing steps. Implantation of ions is performed, the conductivity type of which is the same as that of the semiconductor substrate 1, and the insulator films 16 are formed. The insulator films 16 and polycrystalline silicon are etched by using a resist pattern (not shown) for the base electrode. The remaining polycrystalline silicon becomes the base electrodes 15. Impurities are diffused from the base electrodes 15 to the epitaxial layer 3 by heat treatment to form the external base region 17 (in FIG. 14).

The side walls 19 are formed on the end faces of the base electrodes 15 and insulator films 16 in the similar manner as the formation of the side walls 10. polycrystalline silicon is formed over the base regions 17, 18. Implantation of ions the conductivity type of which is opposite to that of the semiconductor substrate 1 is performed on the polycrystalline silicon, which is then etched by using a resist pattern (not shown) for the emitter electrode. The remaining polycrystalline silicon becomes the emitter electrode 20. The impurities implanted in the emitter electrode 20 are diffused to the intrinsic base region 18 by heat treatment, so that the emitter region 21 is formed (in FIG. 15).

In the fabrication of the BiCMOS device 300 as above mentioned, overetching when the base electrodes 15 are formed causes the surface of the epitaxial layer 3 to be etched so that the depth of the intrinsic base region 18 is reduced. This introduces the problems of deterioration of an emitter-collector breakdown voltage $BV_{CEO}$ of the bipolar transistor 100 and fluctuation in characteristics of the bipolar transistor 100 due to the amount of overetching. Overetching when the base and emitter electrodes 15 and 20 are formed causes the surface of the source-drains 11 of high concentration to be etched. This introduces the problem of an increasing sheet resistance and an increasing leak between the source-drains 9, 11 and well 4. When the gate electrode 8 is made of material which is etched during the formation of the electrodes 15 and 20, such as polycrystalline silicon, the thickness of the gate electrode 8 is similarly reduced, resulting in the increasing sheet resistance.

SUMMARY OF THE INVENTION

According to one aspect of the present invention, a semiconductor device comprises: a semiconductor substrate having a major surface; a bipolar transistor including a base region formed in the major surface; and a first insulator film formed on the base region, the first insulator film being opened in a predetermined portion on the base region to present a cross section, the cross section of the first insulator film being concavely sloped downward toward a center of the base region around a boundary between the first insulator film and the base region.

The first insulator film in the semiconductor device according to the present invention is concavely sloped downward toward the center of the base region in the vicinity of the boundary between the first insulator film and the base region, to improve coverage of the base electrode. The base resistance is prevented from increasing.

According to another aspect of the present invention, the semiconductor device comprises: a semiconductor substrate having a major surface; a bipolar transistor including a base region formed in the major surface; a first insulator film formed on the base region; and an MOS transistor formed on part of the major surface outside of the first insulator film, the MOS transistor including source and drain regions and a gate insulator film formed in the major surface, a gate electrode formed above the major surface through the gate insulator film and a second insulator film for covering at least the source region, drain region and gate electrode, the first insulator film being opened in a predetermined portion on the base region, the bipolar transistor further including a base electrode formed in part of the predetermined portion, a third insulator film for covering the base electrode and an emitter region formed in an upper portion of the base region outside of the third insulator film.

The first insulator film in the semiconductor device according to the present invention protects the region wherein the bipolar transistor is formed from damages during the formation of the MOS transistor. The second insulator film protects the impurity region of the MOS transistor from damages during the formation of the bipolar transistor.

The present invention is also directed to a method of fabricating a semiconductor device. According to the present invention, the method comprises the steps of: (a) selectively forming a first insulator film on a major surface of a semiconductor substrate; (b) selectively removing the first insulator film by means of isotropic etching and opening the first insulator film in a first predetermined portion to expose the major surface; and (c) forming a base region of a bipolar transistor in the first portion, the first insulator film presenting a cross section in the first portion, the cross section being concavely sloped downward toward a center of the base region around a boundary between the first insulator film and the base region.

According to another aspect of the present invention, the method comprises the steps of: (a) forming a first insulator film on a major surface of a semiconductor substrate and forming an MOS transistor in a region of the major surface outside of the first insulator film; (b) selectively removing the first insulator film to open the first insulator film in a first predetermined portion and expose the major surface; and (c) forming a base region of a bipolar transistor in the first portion, the MOS transistor including source and drain regions and a gate insulator film formed in the major surface, and a gate electrode formed above the major surface through the gate insulator film, the step (b) including the steps of: (b-1) forming a second insulator film covering at least the source region, drain region, gate electrode and base region; and (b-2) selectively removing the second insulator film in the first portion, the step (c) including the steps of: (c-1) forming a first semiconductor layer covering the major surface exposed in the first portion and including first impurities having a conductivity type opposite to the semiconductor substrate, and a third insulator film covering the first semiconductor layer; (c-2) selectively removing the first semiconductor layer and third insulator film in a second predetermined portion which is in the first portion to expose the major surface; (c-3) diffusing the first impurities from the first semiconductor layer to the major surface in the first portion by heat treatment; (c-4) selectively introducing second impurities having a conductivity type identical with the semiconductor substrate into the base region through the second portion which is opened; and (c-5) introducing third impurities having a conductivity type opposite to the semiconductor substrate into the major surface through at least the second portion.

The method according to the present invention is suitable for fabrication of the semiconductor device of the present invention.

It is a primary object of the present invention to provide a semiconductor device which improves coverage of a base electrode of a bipolar transistor and prevents a base resistance from increasing, and a method of fabricating the same.

It is another object of the present invention to provide a semiconductor device which is capable of stabilizing characteristics of a bipolar transistor without using an increasing number of masks when overetching occurs during the formation of a base electrode and which prevents a surface of source-drain and a gate electrode of an MOS transistor from being etched due to overetching during the formation of base and emitter electrodes, and a method of suitably fabricating the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
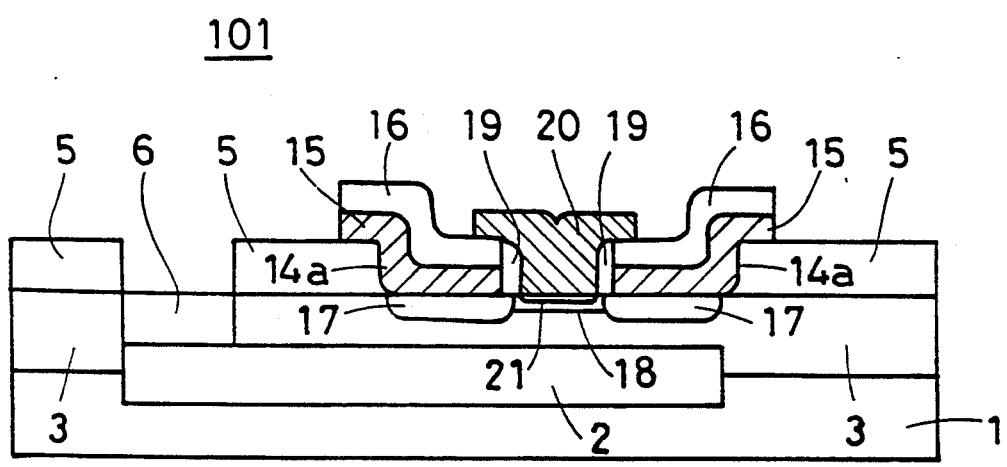
FIG. 1 is a cross-sectional view showing a first preferred embodiment according to the present invention.

FIG. 1 is a cross-sectional view of a bipolar transistor 101 according to a first preferred embodiment of the present invention. The bipolar transistor 101 is different from the transistor 100 of FIG. 9 only in the shape of cross sections 14a of insulator films 5. The cross sections 14a are roundedly sloped downward from the insulator films 5 toward an emitter region 21 in the vicinity of the surface of an epitaxial layer 3 including external base regions 17. An improvement is made on coverage of base electrodes 15 over the external base regions 17, so that a base resistance is prevented from increasing.

Figure 2:
FIGS. 2 and 3 are cross-sectional views showing a second preferred embodiment in sequence of fabrication according to the present invention.
Figure 3:
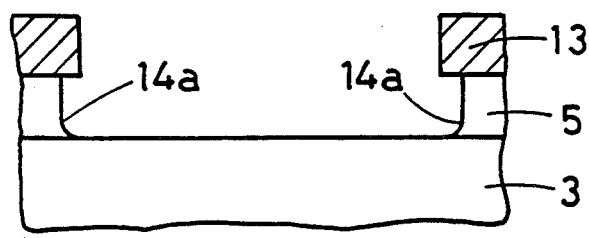
Figure 4:
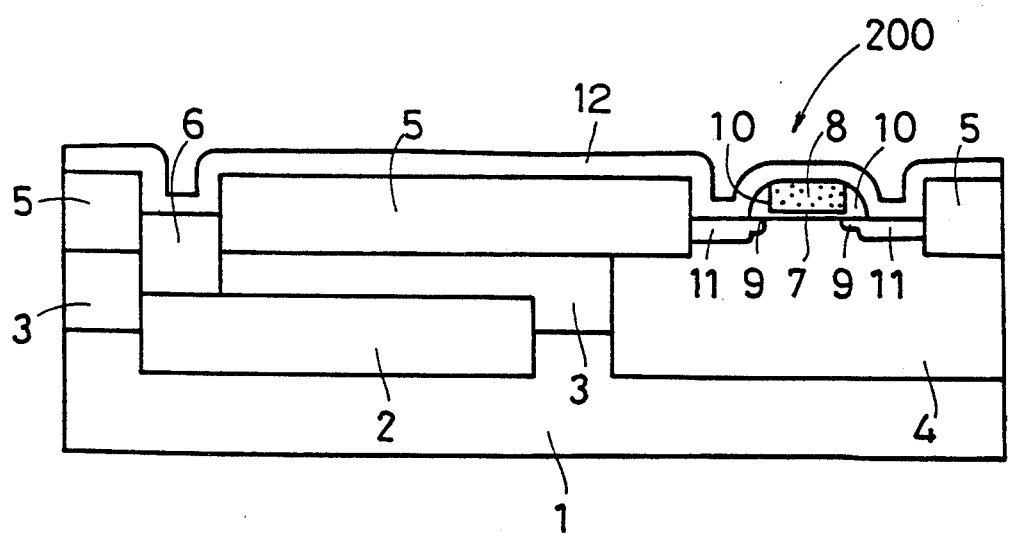
FIGS. 4 to 7 are cross-sectional views showing a third preferred embodiment in sequence of fabrication according to the present invention.
Figure 5:
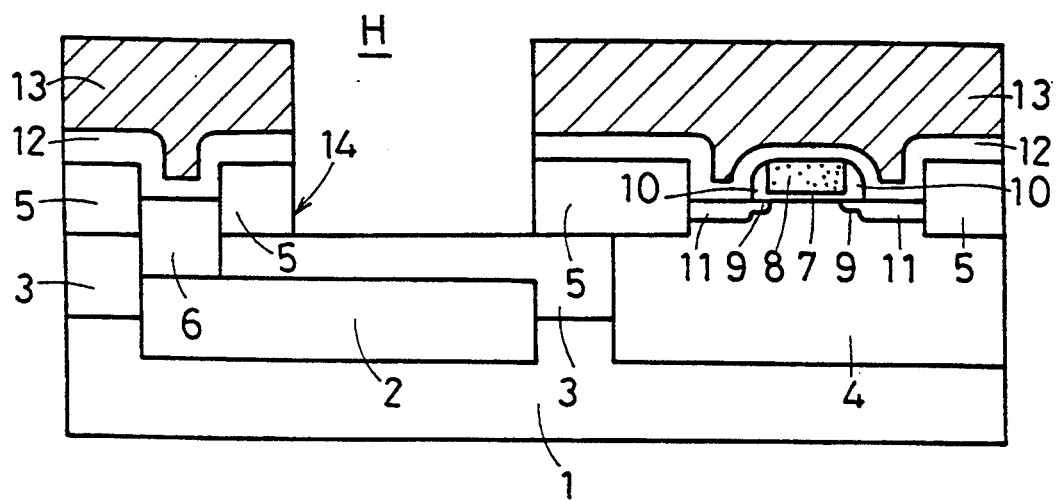
Figure 6:
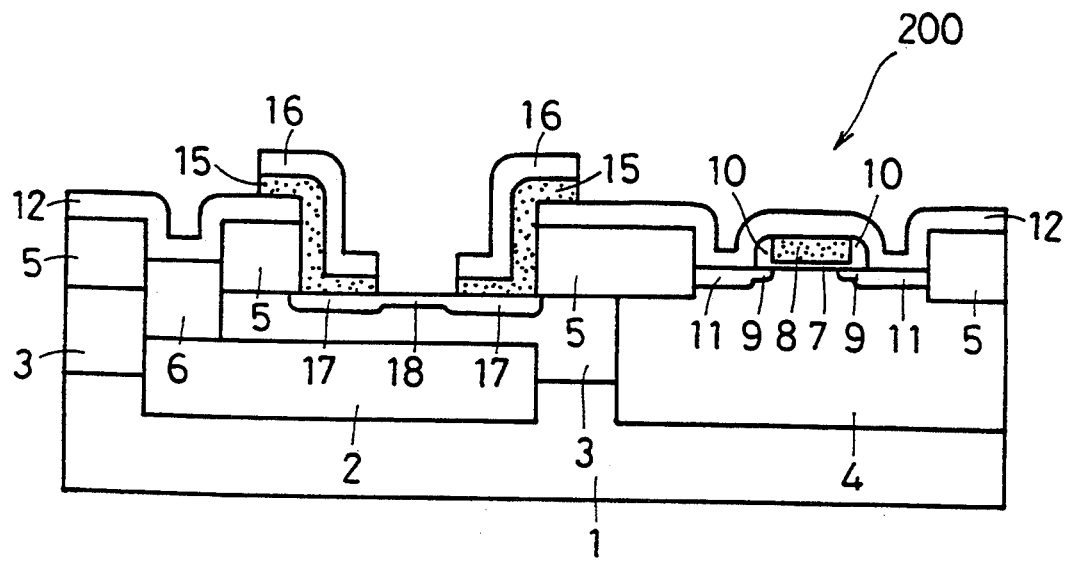
Figure 7:
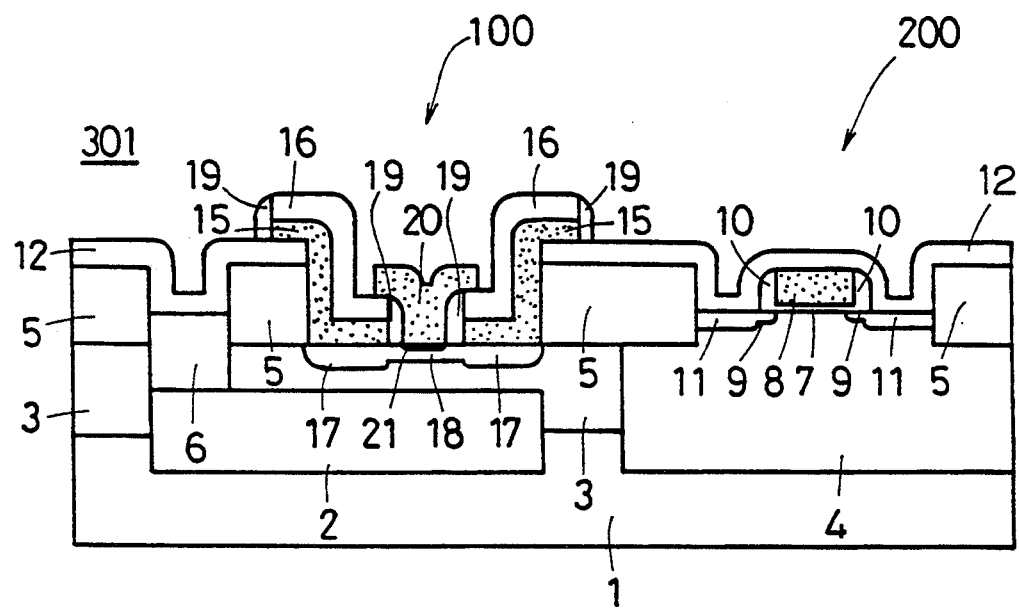
Figure 10:
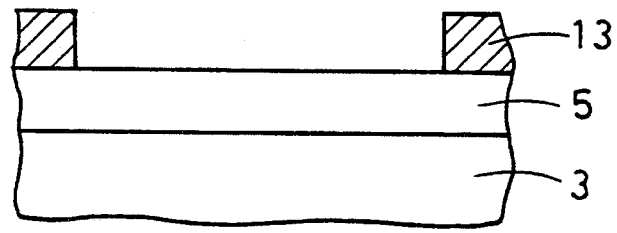
FIGS. 10 and 11 are cross-sectional views showing the prior art in sequence of fabrication.
Figure 11:
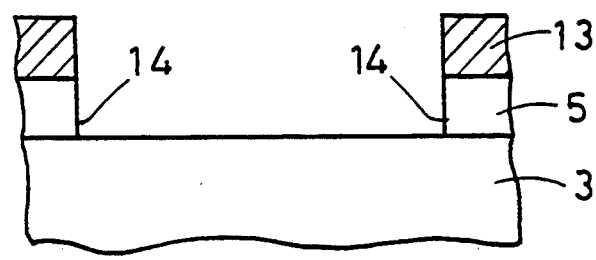
Figure 12:
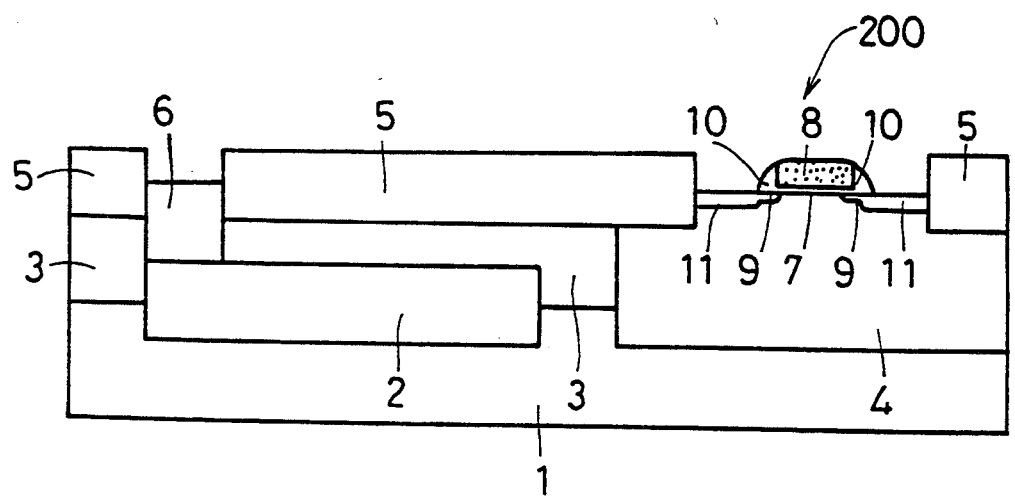
FIGS. 12 to 15 are cross-sectional views showing the background art of the present invention in sequence of fabrication.
Figure 13:
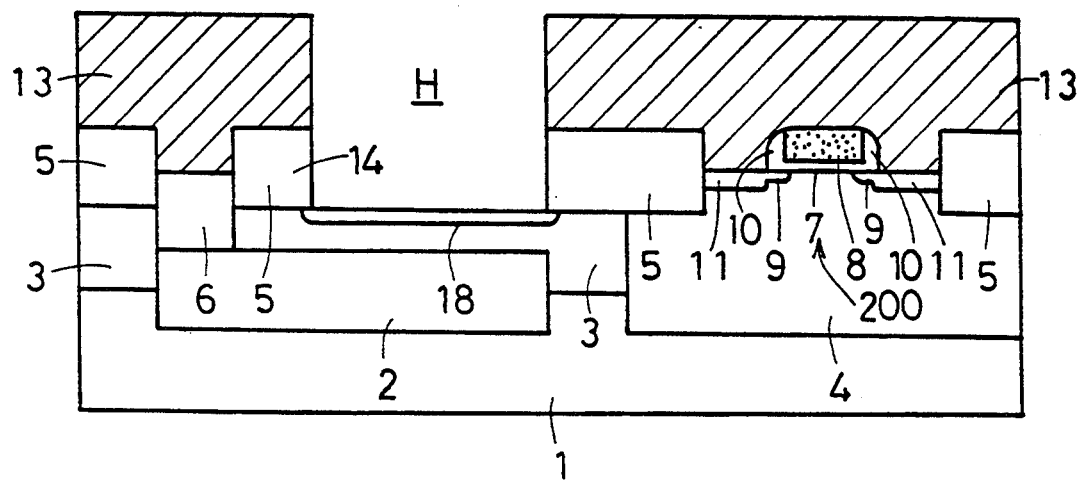
Figure 14:
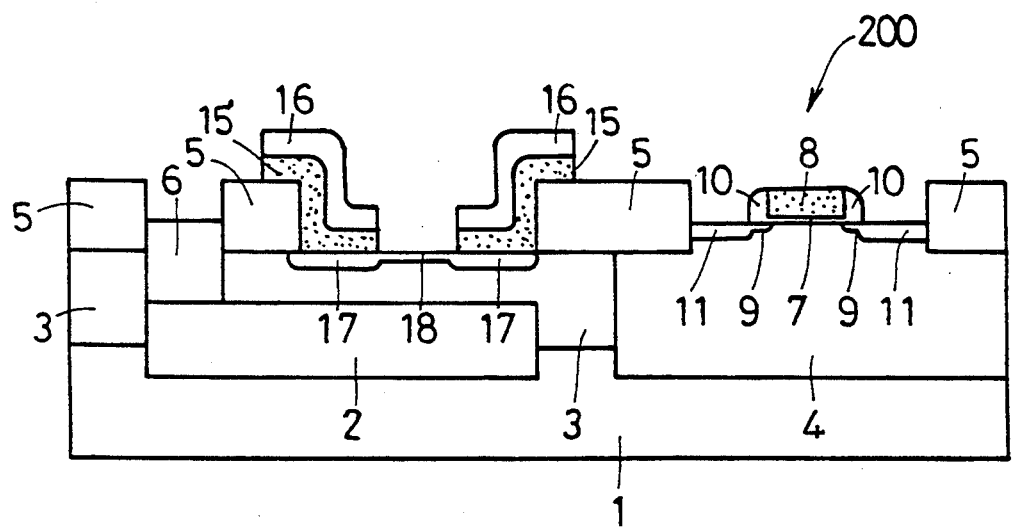

The transistor 101 having the cross sections 14a is achieved by isotropic etching when the insulator film 5 is opened. A second preferred embodiment of the present invention will be described hereinafter. After the provision of a desired resist pattern 13 on the insulator film 5 as shown in FIG. 10, the insulator film 5 is dug halfway by anisotropic etching as shown in FIG. 2. Isotropic etching is then performed on the insulator film 5 to expose the surface of the epitaxial layer 3. Opening the insulator film 5 in this manner provides the cross sections 14a concaved in the vicinity of a boundary between the insulator films 5 and epitaxial layer 3 (in FIG. 3).

The transistor 101 is achieved by successive processings such as impurity introduction and electrode formation in the similar manner to those of the prior art. Isotropic etching may be substituted for the anisotropic etching which is used in the early stage of the etching of the insulator films 5 in the second preferred embodiment.

FIGS. 4 to 7 show a method of fabricating a BiCMOS device 301 in sequence of fabrication according to a third preferred embodiment of the present invention.

Figure 9:
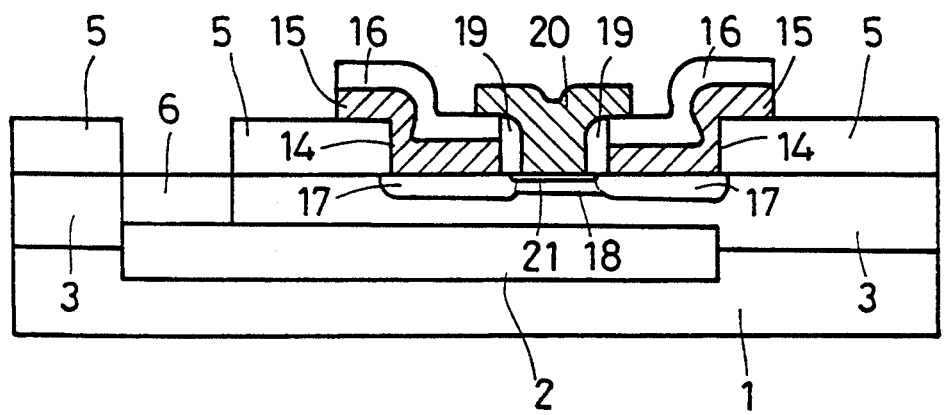
FIG. 9 is a cross-sectional view showing the prior art.

Similarly to the steps described with reference to FIG. 9, the buried layer 2, the epitaxial layer 3, the well 4 and the insulator films 5 are formed on the semiconductor substrate 1, and the MOS transistor 200 is formed on the well 4. An insulator film 12 is formed over the top surface (in FIG. 4).

The insulator films 12 and 5 are etched by using the resist pattern 13 to expose the epitaxial layer 3. This permits an opening H to appear (in FIG. 5).

Figure 15:
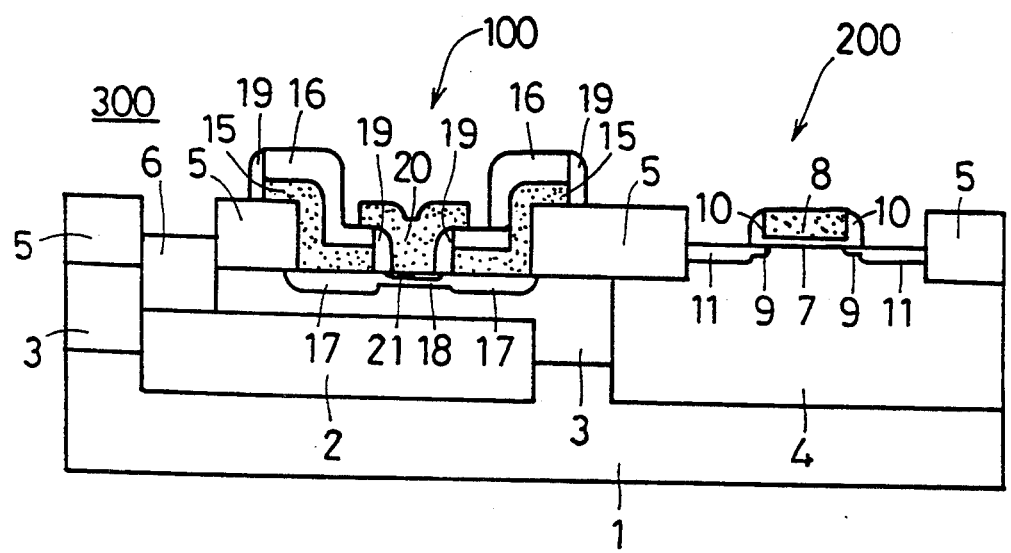

The resist pattern 13 is removed, and polycrystalline silicon 15 is formed over the top surface. Implantation of ions is performed, the conductivity type of which is the same as that of the semiconductor substrate 1. Insulator films 16 are formed, and the insulator films 16 and polycrystalline silicon 15 are etched by using a resist pattern (not shown) for the base electrode. The remaining polycrystalline silicon 15 serves as the base electrodes. Impurities are diffused from the base electrodes 15 to the epitaxial layer 3 by heat treatment, so that the external base region 17 is formed. Implantation of ions the conductivity type of which is the same as that of the semiconductor substrate 1 is performed over the top surface to form an intrinsic base region 18 (in FIG. 6). At this time, a new mask pattern need not be provided because the insulator film 12 serves as a mask. Similarly to the steps described with reference to FIG. 15, the emitter region 21 and the emitter electrode 20 are formed (in FIG. 7). Because of the protection by the insulator film 12, the transistor 200 is not affected by overetching during the formation of the base electrodes 15, by ion implantation during the formation of the regions 18 and by etching during the formation of the emitter electrode 20, in the steps described with reference to FIGS. 6 and 7.

In the foregoing steps, the intrinsic base region 18 is formed after the external base region 17 is formed. The intrinsic base region 18, however, may be formed by overall ion implantation after the formation of the base electrodes 15. This ion implantation is irrespective of the presence/absence of the resist pattern 13 used for the formation of the base electrodes 15, The heat treatment for the formation of the external base region 17 may be used also for the formation of the emitter region 21. In this case, the external base region 17 is formed when the emitter region 21 is formed.

Ion implantation is not performed when the opening H appears in the foregoing steps, however may be performed (irrespective of the presence/absence of the resist pattern 13). An impurity layer formed through the opening H functions to connect the external base region 17 to the intrinsic base region 18. The intrinsic base region 18 must be formed after the formation of the base electrodes 15.

The MOS transistor 200 has an LDD structure including source-drains 9 of low concentration and source-drains 11 of high concentration in this preferred embodiment. Similar effects are obtained when the MOS transistor 200 has a single drain structure including only one type of source-drain to avoid the damage in the top surface by etching of the gate electrode 8.

Figure 8:
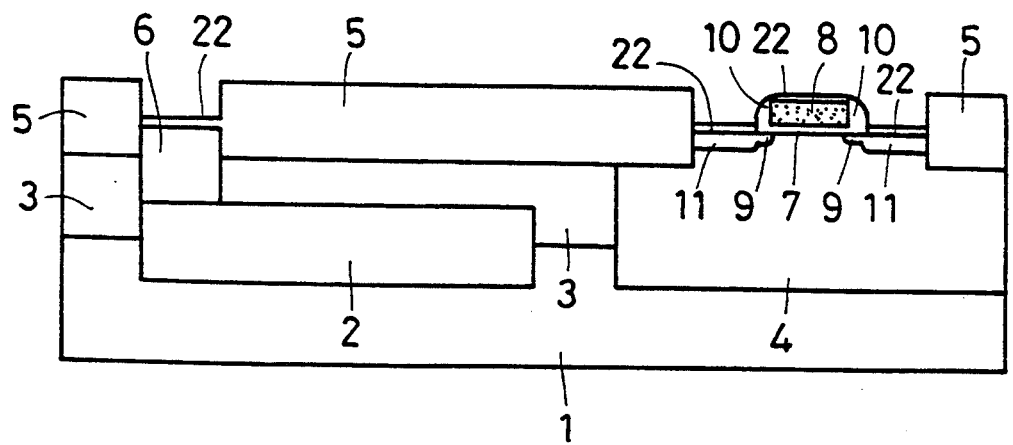
FIG. 8 is a cross-sectional view showing a fourth preferred embodiment according to the present invention.

In the third preferred embodiment, the insulator film 12 formed over the structure prevents the surface of the structure and the gate electrode 8 from being etched due to the overetching during the formation of the base and emitter electrodes 15 and 20. Similar effects are obtained by insulator films 22 formed on the surfaces of the gate electrode 8 and source-drains 9, 11 by thermal oxidation after the formation of the source-drains 11 of high concentration in a fourth preferred embodiment of the present invention as shown in FIG. 8. The insulator films 22 on the gate electrode 8 may be provided, without the thermal oxidation, by forming an insulator film before the restriction on the form of the gate electrode and by etching the insulator film using a resist pattern for the gate electrode.

In the third and fourth preferred embodiments, processes for opening the insulator film 5 left on the regions 17 and 18 are not particularly referred to. In one of the processes in which anisotropic etching is used, damages in the base region by the etching possibly deteriorates the characteristics of the bipolar transistor 100. To avoid this, it is preferable to use the etching which causes less damages, such as isotropic etching, as in the first preferred embodiment. When only the isotropic etching is used, the opening grows considerably larger than the resist pattern. The isotropic etching is preferably used in combination with anisotropic etching (in FIGS. 2 and 3).

While the invention has been shown and described in detail, the foregoing description is in all aspects illustrative and not restrictive. It is therefore understood that numerous modifications and variations can be devised without departing from the scope of the invention.

We claim:

1. A semiconductor device comprising:
a semiconductor substrate having a major surface;
a bipolar transistor including a base region formed in said major surface;
a first insulator film formed on said base region, said first insulator film being opened in a predetermined portion on said base region to present a cross section, said cross section of said first insulator film being concavely sloped downward toward a center of said base region around a boundary between said first insulator film and said base region; and an MOS transistor formed on part of said major surface outside of said first insulator film, said MOS transistor including source and drain regions and a gate insulator film formed on said major surface, a gate electrode formed above said major surface through said gate insulator film and a second insulator film for covering at least said source region, drain region and gate electrode, said bipolar transistor further including a base electrode formed on said base region and said second insulator film, a third insulator film for covering said base electrode and an emitter region formed in an upper portion of said base region outside of said third insulator film.

2. The semiconductor device of claim 1, wherein said second insulator film is also formed on said first insulator film.

3. The semiconductor device of claim 1, wherein said first and second insulator films are opened in said predetermined portion on said base region.

4. A semiconductor device comprising:
a semiconductor substrate having a major surface;
a bipolar transistor including a base region formed in said major surface;
a first insulator film formed on said base region; and
an MOS transistor formed on part of said major surface outside of said first insulator film, said MOS transistor including source and drain regions and a gate insulator film formed on said major surface, a gate electrode formed above said major surface through said gate insulator film and a second insulator film for covering at least said source region, drain region and gate electrode, said first insulator film being opened in a predetermined portion on said base region, said bipolar transistor further including a base electrode formed on said base region and said second insulator film, a third insulator film for covering said base electrode and an emitter region formed in an upper portion of said base region outside of said third insulator film.

5. The semiconductor device of claim 4, wherein said second insulator film is also formed on said first insulator film.

6. The semiconductor device of claim 4, wherein said first and second insulator films are opened in said predetermined portion on said base region.

* * * * *